US011145648B2

United States Patent
Dasgupta et al.

(10) Patent No.: US 11,145,648 B2
(45) Date of Patent: Oct. 12, 2021

(54) ENHANCEMENT/DEPLETION DEVICE PAIRS AND METHODS OF PRODUCING THE SAME

(71) Applicant: Intel Corporation, Santa Clara, CA (US)

(72) Inventors: Sansaptak Dasgupta, Hillsboro, OR (US); Han Wui Then, Portland, OR (US); Marko Radosavljevic, Portland, OR (US); Paul B. Fischer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/489,847

(22) PCT Filed: Mar. 31, 2017

(86) PCT No.: PCT/US2017/025457
§ 371 (c)(1),
(2) Date: Aug. 29, 2019

(87) PCT Pub. No.: WO2018/182704
PCT Pub. Date: Oct. 4, 2018

(65) Prior Publication Data
US 2020/0043917 A1 Feb. 6, 2020

(51) Int. Cl.
| | |
|---|---|
| *H01L 27/088* | (2006.01) |
| *H01L 27/085* | (2006.01) |
| *H01L 29/20* | (2006.01) |
| *H01L 29/66* | (2006.01) |
| *H01L 29/778* | (2006.01) |
| *H01L 29/739* | (2006.01) |

(Continued)

(52) U.S. Cl.
CPC ...... *H01L 27/0883* (2013.01); *H01L 21/8252* (2013.01); *H01L 29/2003* (2013.01); *H01L 29/205* (2013.01); *H01L 29/66462* (2013.01); *H01L 29/7786* (2013.01)

(58) Field of Classification Search
CPC .................. H01L 29/7786; H01L 27/0883
See application file for complete search history.

(56) References Cited

U.S. PATENT DOCUMENTS

| | | | |
|---|---|---|---|
| 6,653,694 B1 | 11/2003 | Osanai | |
| 9,431,527 B1 * | 8/2016 | Luo | ..................... H01L 29/4236 |

(Continued)

FOREIGN PATENT DOCUMENTS

WO        2015009249         1/2015

OTHER PUBLICATIONS

International Search Report & Written Opinion, dated Dec. 28, 2017, for PCT Patent Application No. PCT/US2017/025457.

*Primary Examiner* — Omar F Mojaddedi
(74) *Attorney, Agent, or Firm* — Green, Howard & Mughal LLP

(57) ABSTRACT

Enhancement/depletion device pairs and methods of producing the same are disclosed. A disclosed example multi-layered die includes a depletion mode device that includes a first polarization layer and a voltage tuning layer, and an enhancement mode device adjacent the depletion mode device, where the enhancement mode device includes a second polarization layer, and where the second polarization layer includes an opening corresponding to a gate of the enhancement mode device.

20 Claims, 10 Drawing Sheets

(51) Int. Cl.
*H01L 21/8252* (2006.01)
*H01L 29/205* (2006.01)

(56) References Cited

U.S. PATENT DOCUMENTS

| | | | |
|---|---|---|---|
| 2002/0171076 A1* | 11/2002 | Danzilio | H01L 27/0605 |
| | | | 257/12 |
| 2006/0208279 A1* | 9/2006 | Robinson | H01L 29/66462 |
| | | | 257/194 |
| 2010/0079169 A1 | 4/2010 | Kim et al. | |
| 2010/0102397 A1 | 4/2010 | Park et al. | |
| 2011/0210377 A1* | 9/2011 | Haeberlen | H01L 29/205 |
| | | | 257/194 |
| 2014/0042452 A1* | 2/2014 | Pendharkar | H01L 21/8252 |
| | | | 257/76 |
| 2017/0069743 A1* | 3/2017 | Roberts | H01L 29/7783 |

* cited by examiner

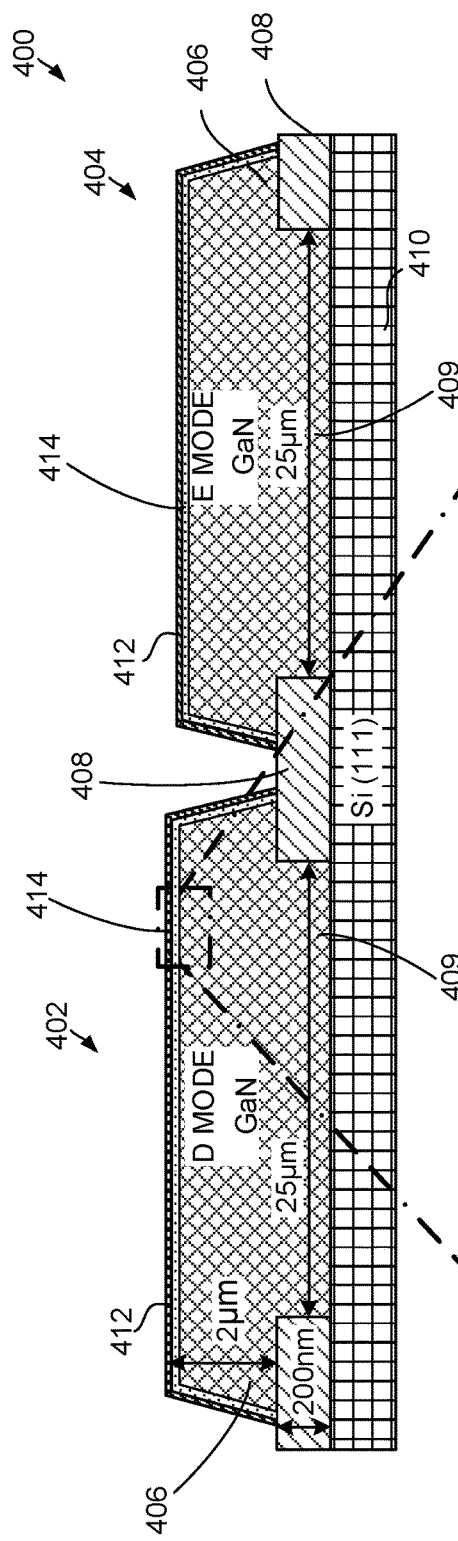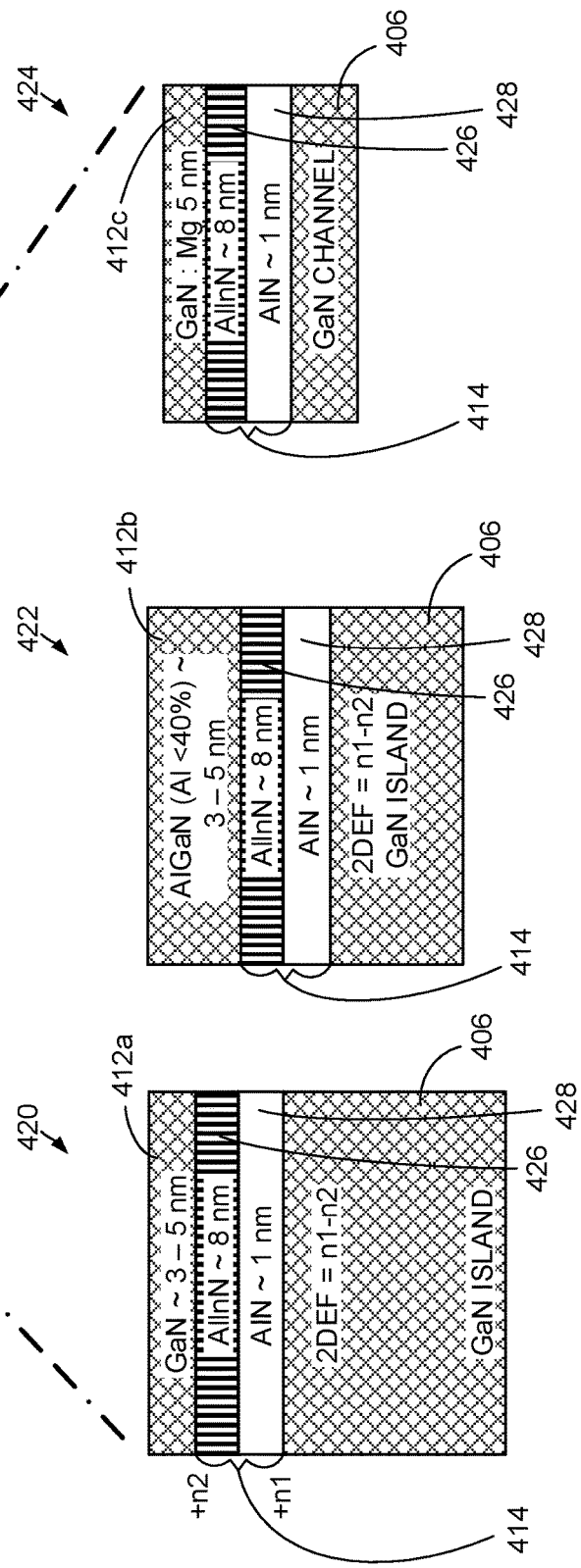
FIG. 4A
FIG. 4B

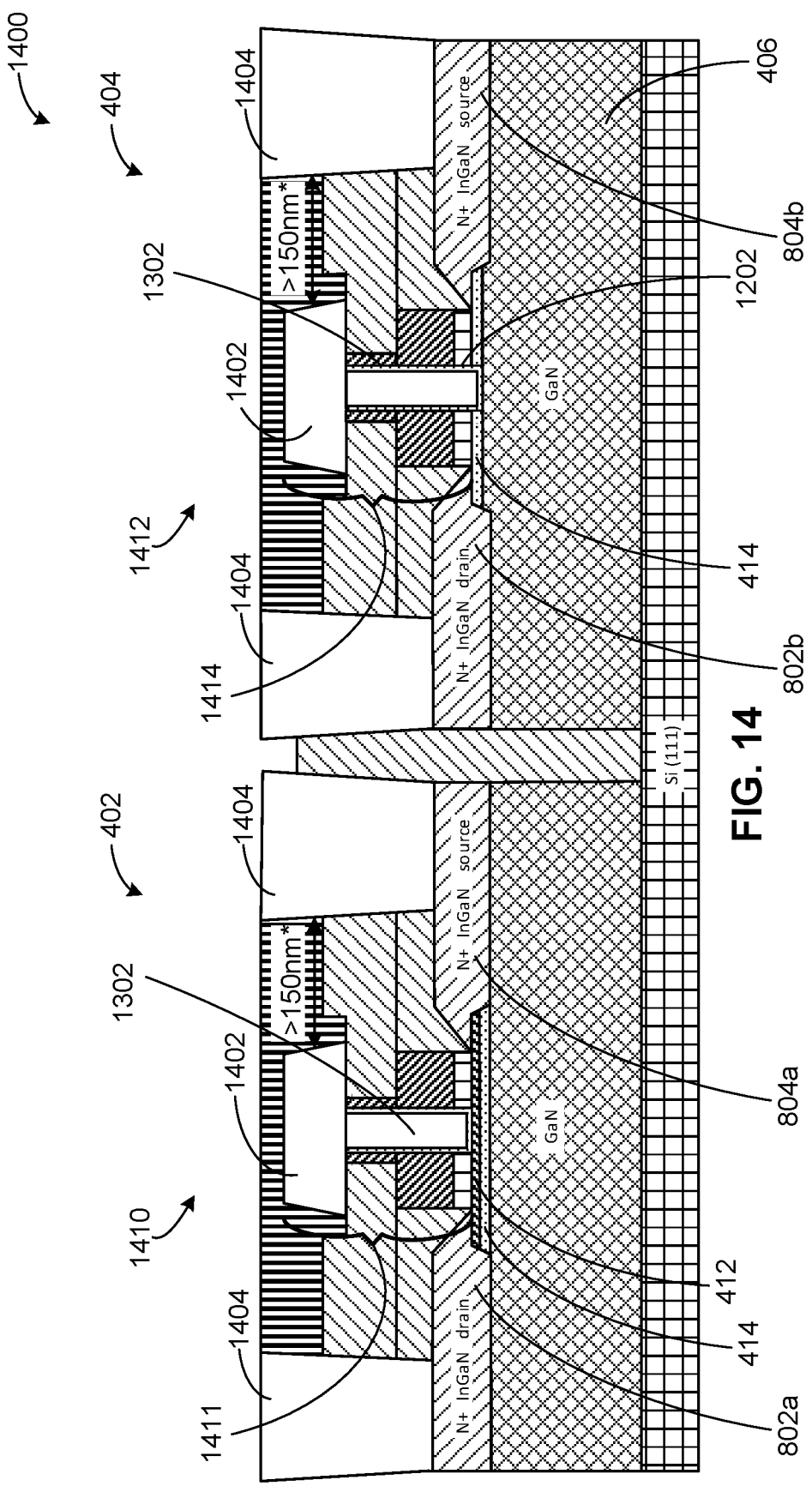

US 11,145,648 B2
1

ENHANCEMENT/DEPLETION DEVICE PAIRS AND METHODS OF PRODUCING THE SAME

CLAIM OF PRIORITY

This Application is a National Stage Entry of, and claims priority to, PCT Application No. PCT/US2017/025457, filed on Mar. 31, 2017 and titled ENHANCEMENT/DEPLETION DEVICE PAIRS AND METHODS OF PRODUCING THE SAME", which is incorporated by reference in its entirety for all purposes.

FIELD OF THE DISCLOSURE

This disclosure relates generally to semiconductor fabrication, and, more particularly, to enhancement/depletion device pairs and methods of producing the same.

BACKGROUND

Semiconductor devices such as microprocessors (e.g., processors) have become smaller and more compact, while their die transistor counts have increased dramatically due to increasing computational needs (e.g., transistor counts in the billions). With this increased compactness, both enhancement devices and depletion devices have been fabricated onto semiconductor devices. In particular, these enhancement devices and depletion devices have been implemented in radio frequency front-end modules (FEMs) as well as silicon on chip (SoC) integrated circuits.

Usually the enhancement devices and depletion mode devices, which are often electrically coupled to one another in pairs, are separated on different and/or distant regions of a die, thereby necessitating a need for significant wiring, wire routing and/or routing complexity, all of which can result in electrical loss and, in turn, power inefficiency. As a result, known semiconductor devices using both enhancement and depletion devices can require more power. Further, the necessitated increase in wiring complexity may increase cost and/or size of corresponding dies and/or packaging.

To maintain proper electrical performance and/or low power usage (e.g., a relatively low state retention and/or power use), some known devices may utilize significantly taller depletion mode devices. Due to the resulting topographical variation (e.g., variation(s) in height) between the enhancement mode devices and corresponding depletion mode devices, relatively large device packaging may be required.

BRIEF DESCRIPTION OF THE DRAWINGS

FIG. 4A is a detailed cross-sectional view along a line 4-4 of FIG. 2B depicting an example step to produce an example E/D device in accordance with the teachings of this disclosure.

FIG. 4B illustrates example polarization stacks in accordance with the teachings of this disclosure.

FIGS. 5-14 are cross-sectional views of the example multilayered structure of FIG. 4A at various stages of fabrication to produce an example E/D device in accordance with the teachings of this disclosure.

Figure 1:
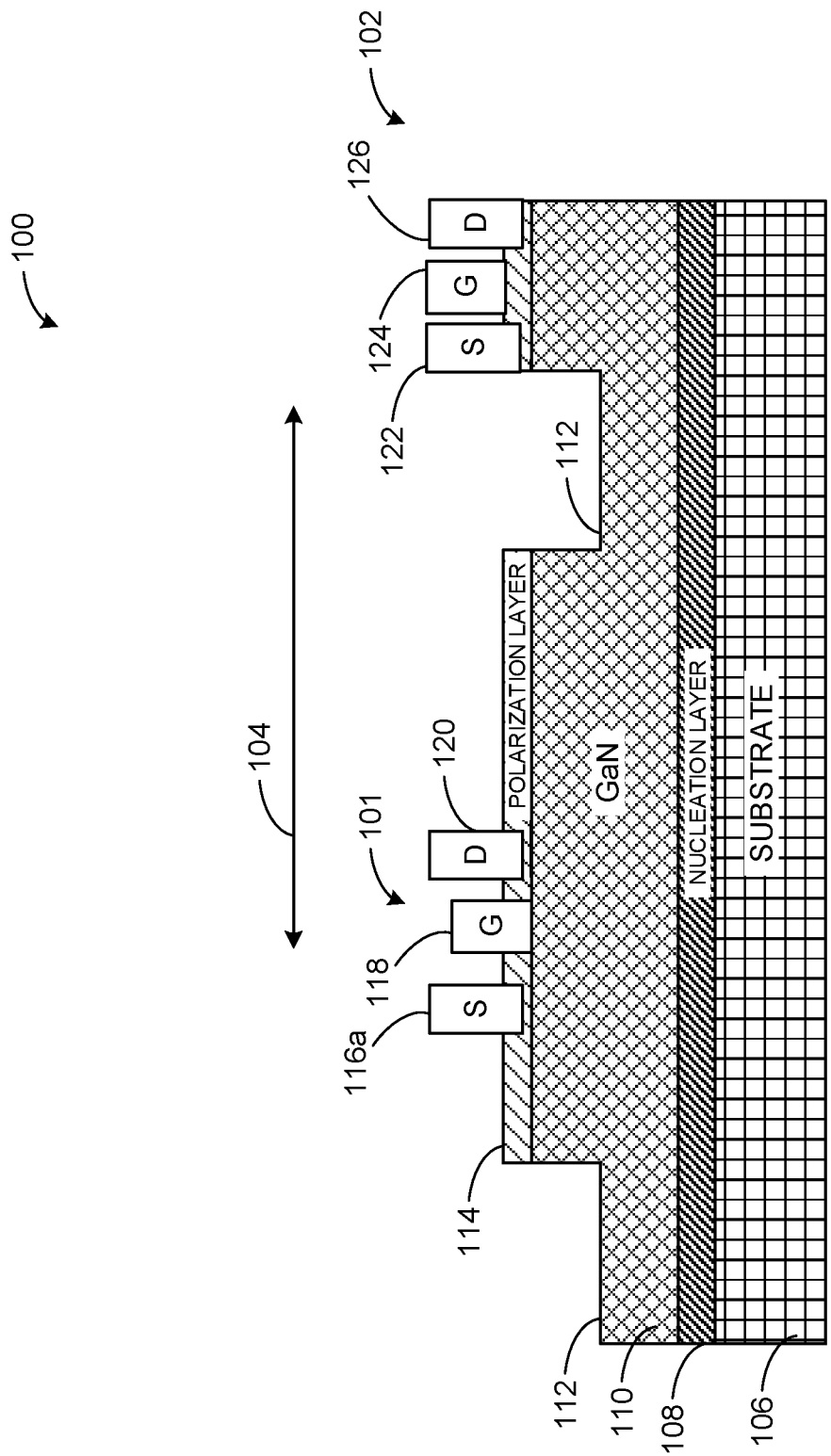
FIG. 1 is a cross-sectional view of a known semiconductor device having both enhancement and depletion devices.

The figures are not to scale. Instead, to clarify multiple layers and regions, the thickness of the layers may be enlarged in the drawings. Wherever possible, the same reference numbers will be used throughout the drawing(s) and accompanying written description to refer to the same or like parts. As used in this patent, stating that any part (e.g., a layer, film, etc.) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

Enhancement/depletion device pairs and methods of producing the same are disclosed. Known integrated circuits (e.g., integrated circuit devices) such as radio frequency front-end modules and/or silicon on chip (SoC) devices known as enhancement/depletion (E/D) devices typically integrate enhancement mode devices and depletion mode devices, both of which are electrically coupled together in pairs located on distinct distant portions or regions of a semiconductor device. For example, an enhancement mode device and a depletion mode device that are electrically coupled together may be distributed on various locations of a semiconductor die. In such examples, the enhancement mode device and the depletion mode device are often separated in distinct and distant enhancement mode device regions and depletion mode device regions, respectively, thereby necessitating significant wiring, and/or routing complexity, both of which can result in power inefficiencies. Further, performance requirements may necessitate height differences between enhancement mode devices and depletion mode devices (e.g., taller depletion mode devices), thereby resulting in significantly larger packaging.

The examples disclosed herein enable power-efficient and cost-effective integration of enhancement mode devices and depletion mode devices. In particular, the examples disclosed herein are related to semiconductor fabricated enhancement/depletion (E/D) devices that include repeating pairs (e.g., E/D device pairs) of adjacent and/or close proximity enhancement and depletion (e.g., depletion load) devices, hereinafter referred to as E-mode devices and D-mode devices, respectively. Such repeating pairs are fabricated on a die consisting of multiple layers, for example.

The examples disclosed herein also utilize a polarization layer in conjunction with a voltage tuning layer to reduce overall power consumption. In particular, the voltage tuning layer may be partially/selectively etched at areas corresponding to E-mode devices of each E/D device pair to reduce load current necessary for state retention, thereby significantly reducing power requirement needs.

Further, the examples disclosed herein enable more compact E/D devices by enabling each device of an E/D device mode pair to have similar heights by not necessitating a taller D-mode device as well as reducing routing complexity, for example. The examples disclosed herein may be implemented in integrated circuits, processors, radio frequency (RF) front-end modules, voltage regulator (e.g., voltage regulator circuits) and/or complementary metal-oxide semiconductor (CMOS) integrated circuits, for example.

In some examples, a voltage tuning layer includes a gallium nitride layer or an aluminum gallium nitride layer, either of which may be doped (e.g., p-type doped). According to the examples disclosed herein, the voltage tuning layer may be disposed above (e.g., above with reference to a fabrication stacking direction) a polarization layer, which can include both aluminum indium nitride and aluminum nitride layers. In some examples, the E-mode and D-mode devices are implemented as transistors that are arranged in adjacent fabricated device pairs.

As used herein, the term "voltage tuning layer" refers to a layer, multilayered structure or film that is used to offset and/or adjust a logic controlling voltage such as a trigger voltage and/or state retention voltage. As used herein, the terms "enhancement mode device," "enhancement device" or "E-mode device" refers to a logic device or circuit that operates at a positive (greater than zero or positive) voltage threshold. Accordingly, as used herein, the terms "depletion mode device," depletion device" or "D-mode device" refers to a logic device or circuit that operates at a negative (less than zero or negative) voltage threshold.

As used herein, stating that two or more portions or devices include a same layer, does not necessarily mean that the layer extends between both of the devices. Accordingly, first and second fabricated devices on a wafer and/or die can have first and second layers, respectively, both of which may be defined during a single and/or same layering process. Thus, two fabricated devices (e.g., two adjacent devices) may each have portions of a same layer disposed within. As used herein, the term "adjacent" refers to being next to another component and/or being within 50 nanometers (nm) from one another (e.g., in a lateral direction of a surface plane defined by a die).

FIG. 1 is a cross-sectional view of a known semiconductor device 100. As can be seen in the view of FIG. 1, the known semiconductor device 100 includes an E-mode device region 101 and a D-mode device region 102, both of which are separated by distance that is generally indicated by a dimension 104, which can be approximately 100 to 200 micrometers (µm). The semiconductor device 100 also includes a substrate 106, a nucleation layer 108, a semiconductor body 110 with etched regions 112, and a polarization layer 114. Further, a source 116, a gate 118 and a drain 120 are to define an enhancement mode device (e.g., a transistor) of the E-mode device region 101 in later fabrication steps. Similarly, a source 122, a gate 124 and a drain 126 are to define a depletion mode device (e.g., a transistor) of the D-mode region 102 in later fabrication steps.

In this example, the E-mode device region 101 and the D-mode device region 102 are disposed above the semiconductor body 110, which is composed of gallium nitride. As can also be seen in FIG. 1, portions of the body 110 are covered by the polarization layer 114, which has been etched (e.g., partially or selectively etched) so that the gate 118 in the E-mode device region 101 extends into and/or through the polarization layer 114.

Figure 2:
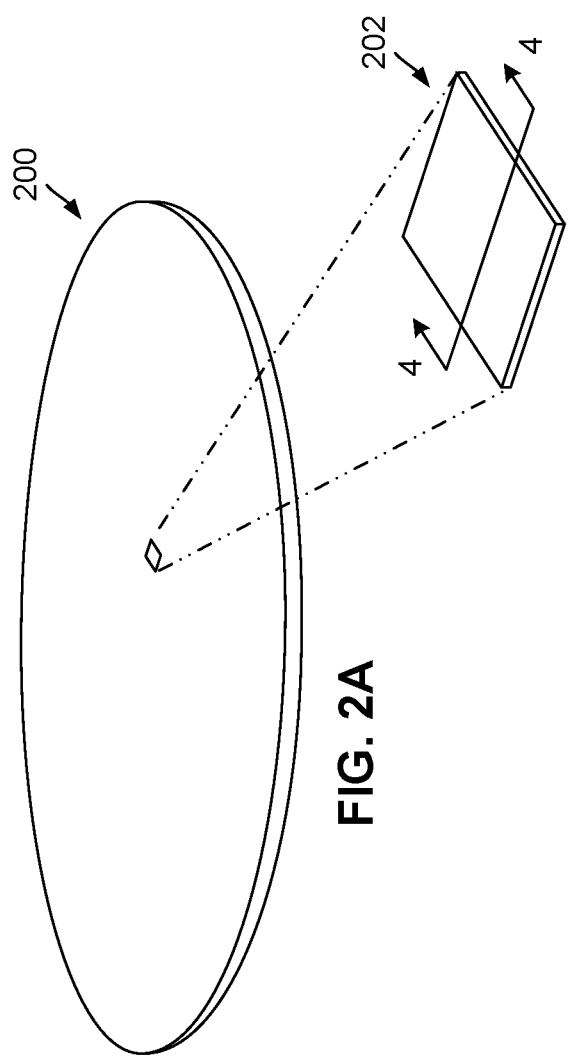
FIG. 2A illustrates an example wafer in which the examples disclosed herein may be implemented.
FIG. 2B illustrates an example die of the wafer of FIG. 2A.

FIG. 2A illustrates an example wafer 200 in which the examples disclosed herein may be implemented. The wafer 200 of the illustrated example consists of multiple semiconductor dies (e.g., system on a chip dies). In particular, dies consisting of E/D device pairs in accordance with the teachings of this disclosure may be fabricated via numerous layering as well as etching processes, for example, and tested. In this example, the individual semiconductor dies are functionally tested prior to being separated (e.g., cut) from the wafer 200. In some examples, test patterns are provided to each individual die and each individual die is monitored to have a designated response. In some examples, faulty dies discovered during this testing are discarded.

FIG. 2B illustrates an example die or system on a chip (e.g., a system on a chip die) 202 of the wafer 200 of FIG. 2A. In this example, the die 202 is cut from the wafer 200 and separated (e.g., cut and/or sliced) from the wafer 200 after being successfully tested with the aforementioned functionality test described above. The details of cross-section 4-4 are described in detail below in connection with FIG. 4A (and subsequent processing steps described in connection with FIGS. 5-14). The die 202 of the illustrated example may be implemented as an integrated circuit, a processor, a silicon on chip device and/or a radio frequency module, etc.

Figure 3:
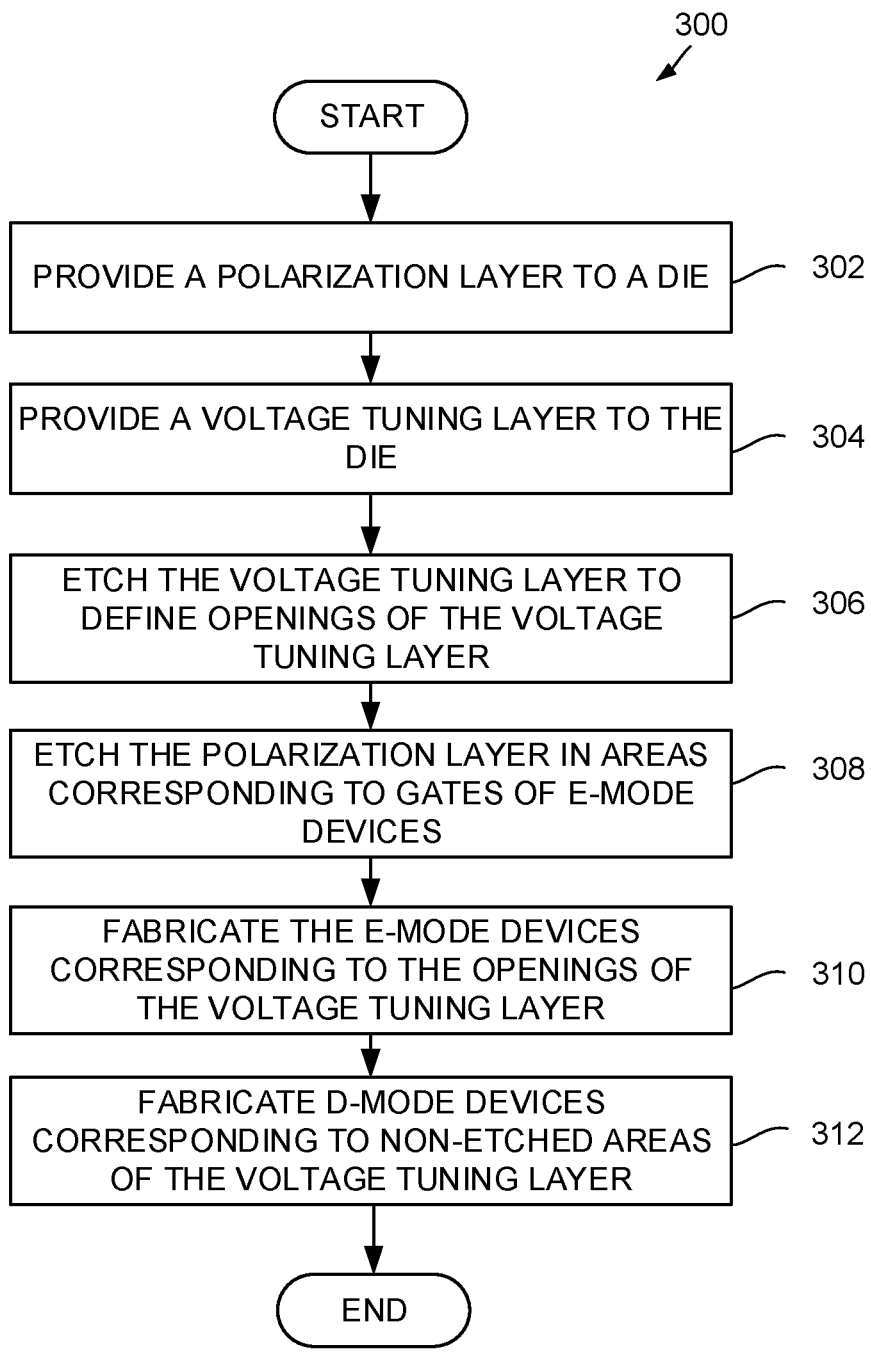
FIG. 3 is a flowchart representative of an example method to produce enhancement/depletion (E/D) devices in accordance with the teachings of this disclosure.

FIG. 3 is a flow chart representative of an example 300 in accordance with the teachings of this disclosure. The example method 300 of FIG. 3 begins as a wafer (e.g., the wafer 200), which has a plurality of dies and/or silicon on chip devices to be defined thereon, is being fabricated. In particular, multiple layers are being placed (e.g., stacked and/or applied/deposited) and numerous etching and/or exposure processes are being used to produce and/or define multilayered dies on the wafer that include E/D device pairs in accordance with the teachings of this disclosure.

In this example, a polarization layer (e.g., a polarization stack, etc.) is provided (e.g., deposited) and/or defined onto a die (e.g., a substrate of a die) (block 302). In particular, the polarization layer of the illustrated example is applied to areas in which E-mode and D-mode device pairs are to be defined on a layer of the die. Additionally or alternatively, the polarization layer is applied or deposited over an entire layer of die and/or respective wafer. In some examples, the polarization layer is applied as a pattern (e.g., by a lithography process, etc.) including openings based on future E/D device pair placements and/or fabrication.

According to the illustrated example, a voltage tuning layer (e.g., a voltage tuning layer, a voltage threshold adjustment layer) is provided and/or deposited (e.g., via a lithography process) onto the die (block 304). In this example, the voltage tuning layer is provided above the polarization layer (along a fabrication layer building direction).

In this example, the voltage tuning layer is etched (e.g., selectively etched) to define openings and/or etched areas of the voltage tuning layer (block 306). In particular, the voltage tuning layer in this example is etched to define areas to which the E-mode devices are to be defined. In other words, openings of the voltage tuning layer correspond to where the E-mode devices of the device pairs are to be fabricated (e.g., the fabricated E-mode devices will not include the voltage tuning layer extending across any portion). Additionally or alternatively, the voltage tuning layer may be deposited (e.g., in a lithography process) and/or patterned with the openings based on the E-mode devices of the E/D device pairs.

The polarization layer of the illustrated example is then etched in areas of the E-mode devices to which gates are to be defined (block 308). In particular, the polarization layer is etched (e.g., chemically, mechanically, photo-chemically, etc.) in a portion of an E-Mode fabrication area where a gate contact of a corresponding E-mode device is to be defined. In particular, the gate contact will be fabricated in this portion along with a dielectric layer that at least partially surrounds the gate contact. Additionally or alternatively, the polarization layer may be deposited (e.g., in a lithography process) and/or patterned with openings in the areas in which the gates are to be defined.

Next, the E-mode devices are defined and/or fabricated in areas corresponding to the openings of the voltage tuning layer (block 310). In particular, numerous layers are added and etching processes are used to define the E-mode devices, which may be implemented as transistors, for example. In this example, the E-mode devices are defined within the openings of the etched areas of the voltage tuning layer. In other examples, the openings only partially cover the respective E-mode device (e.g. a portion of the E-mode device is covered by the voltage tuning layer).

According to the illustrated example, the D-mode devices are defined and/or fabricated in areas corresponding to non-etched areas of the voltage tuning layer as well as the polarization layer (block 312). In particular, numerous layers are added and etching processes are used to define or fabricate the D-mode devices, which may also be implemented as transistors, for example. In this example, the D-mode devices are fabricated in conjunction with (e.g., in parallel with, simultaneously with, during the same process with) the E-mode devices.

FIG. 4A is a detailed cross-sectional view along the line 4-4 of FIG. 3B that depicts an example multi-layered structure (e.g., a multi-layer die construction, a multilayer semiconductor, a multilayer silicon on chip circuit, etc.) 400 in accordance with the teachings of this disclosure. The multi-layered structure 400 is to be fabricated to include a device pair with a D-mode device and a corresponding E-mode device and includes a D-mode device side 402, an E-mode device side 404, each of which include corresponding bodies (e.g., substrates, substrate bodies, etc.) 406 that are composed of gallium nitride in this example. In this example, the bodies 406 are divided by oxide layers 408, which define corresponding trenches 409, and are disposed above a silicon layer 410, which is composed of silicon 111 (e.g., a silicon with a 1-1-1 orientation), for example. In this example, the trenches 409 are approximately 25 μm in width. However, any appropriate dimension may be used based on design requirements and/or application needs.

According to the illustrated example, the bodies 406 of both the D-mode side 402 and the E-mode side 404 are layered (e.g., layered, applied and/or deposited above in the view of FIG. 4A) with a voltage tuning layer 412 and a polarization layer (e.g., a polarization stack, etc.) 414. In particular, the polarization layer 414 is disposed between the voltage tuning layer 412 and the corresponding body 406.

FIG. 4B illustrates example voltage tuning polarization stacks 420, 422 and 424 in accordance with the teaching of this disclosure. Any of these polarization stacks 420, 422 and 424 and/or combination thereof may be used to implement the examples disclosed herein. As can be seen in FIG. 4B, each of the polarization stacks 420, 422 and 424 are disposed or layered above the respective body 406.

According to the illustrated example of FIG. 4B, the multi-layered polarization stacks 420, 422 and 424 each include the polarization layer 414 having an aluminum indium nitride layer 426, which may have a thickness of 1 to 10 nm (e.g., 8 nm in some applications), and an aluminum nitride layer 428 of approximately 0.5 to 1.5 nm in thickness (e.g., a thickness 1 nm in some applications). In this example, the aluminum nitride layer 428 is below the aluminum indium nitride layer 426 (in the view of FIG. 4B).

To reduce power load requirements/voltage thresholds and/or improve voltage response of respective D-mode devices, the example voltage tuning polarization stacks include the voltage tuning layers 412a, 412b, 412c, respectively. Any of the voltage tuning layers 412a, 412b, 412c may be used to implement the voltage tuning layer 412 shown in FIG. 4A.

The example voltage tuning layer 412a includes gallium nitride, which may be approximately 2 to 8 nm thick (e.g., 3 to 5 nm in some applications). The alternative example voltage tuning layer 412b includes aluminum gallium nitride and may be approximately 2 to 8 nm thick (e.g., 3 to 5 nm in some applications). In such examples where aluminum gallium nitride is implemented, the aluminum content of the aluminum gallium nitride may be lower than approximately 40% by volume. The further alternative voltage tuning layer 412c of FIG. 4B includes doped gallium nitride. In such examples, the doped gallium nitride is p-type doped (e.g., a p-type dopant such as magnesium is applied), which has a similar effect to introducing a net positive charge, thereby electrically reducing the multilayered structure 400.

FIGS. 5-14 are cross-sectional views of the example multilayered structure 400 of FIG. 4A at various stages of fabrication using the example method 300 described above in connection with FIG. 3. The example process shown in these figures are only examples and any appropriate sequence of etching, deposition and/or epitaxial growth, etc. may be used. Further, any appropriate materials, layering stacks or conductors may be used.

Figure 5:
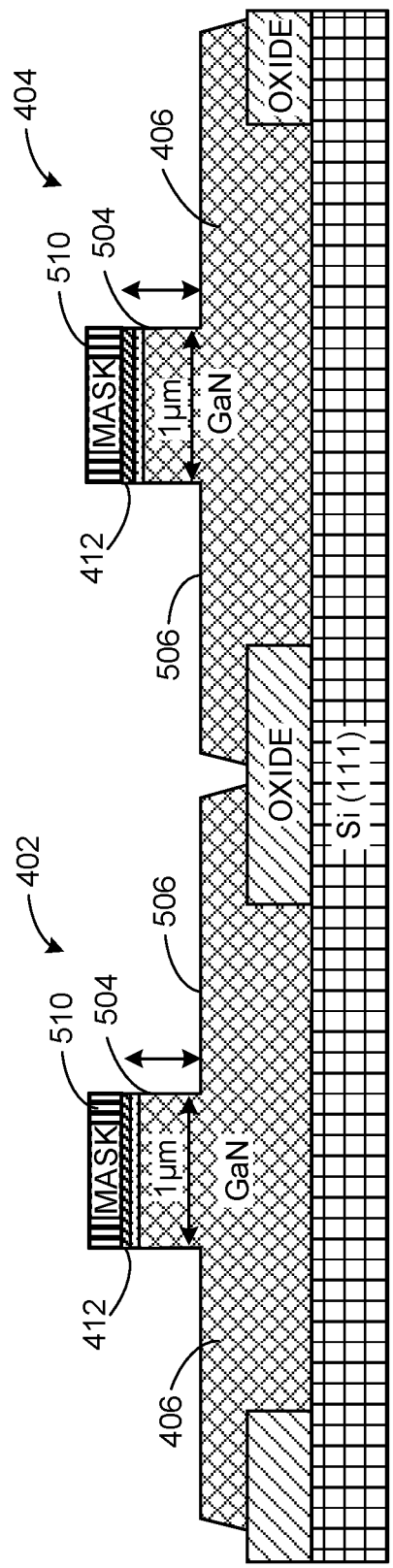

Turning to FIG. 5, the bodies 406 corresponding to the D-mode side 402 and the E-mode side 404 are etched to define corresponding E-mode and D-mode islands, respectively. In particular, etched surfaces 504, 506 are defined as pre-cursors for later fabricated gate structures. In this example, prior to etching, a mask 510 is applied or provided above the aforementioned voltage tuning layer 412, thereby defining multiple layers of the E-mode and D-mode islands.

Figure 6:
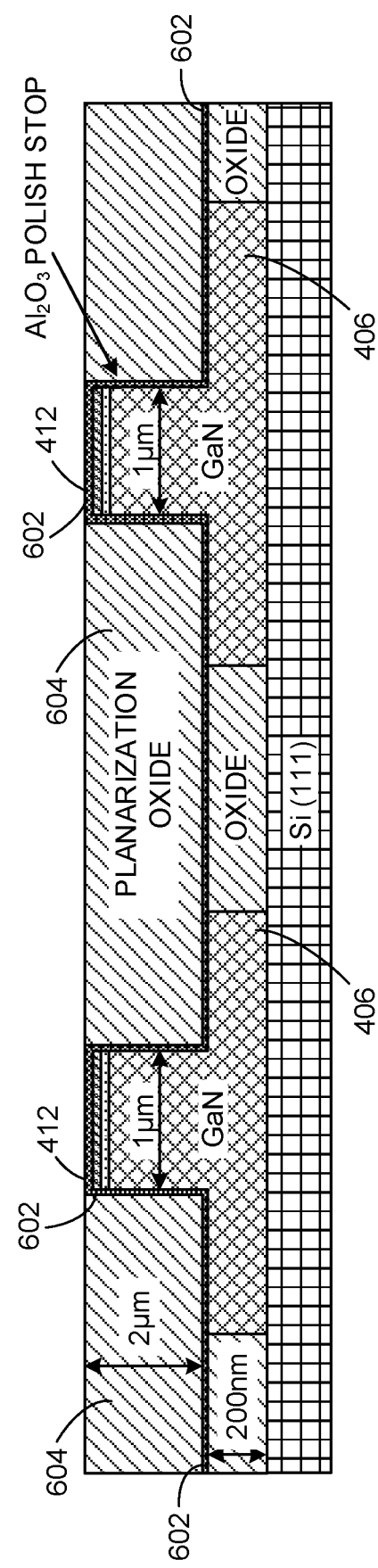

According to the illustrated example of FIG. 6, a polish stop 602 is provided and an interlayer dielectric or a planarization oxide 604 is applied, grown (e.g., epitaxially grown) and/or deposited onto the bodies 406. In this example, the polish stop 602 covers the voltage tuning layer 412. In this example, the polish stop 602 may be at least partially composed of an aluminum oxide (e.g., $Al_2O_3$).

Figure 7:
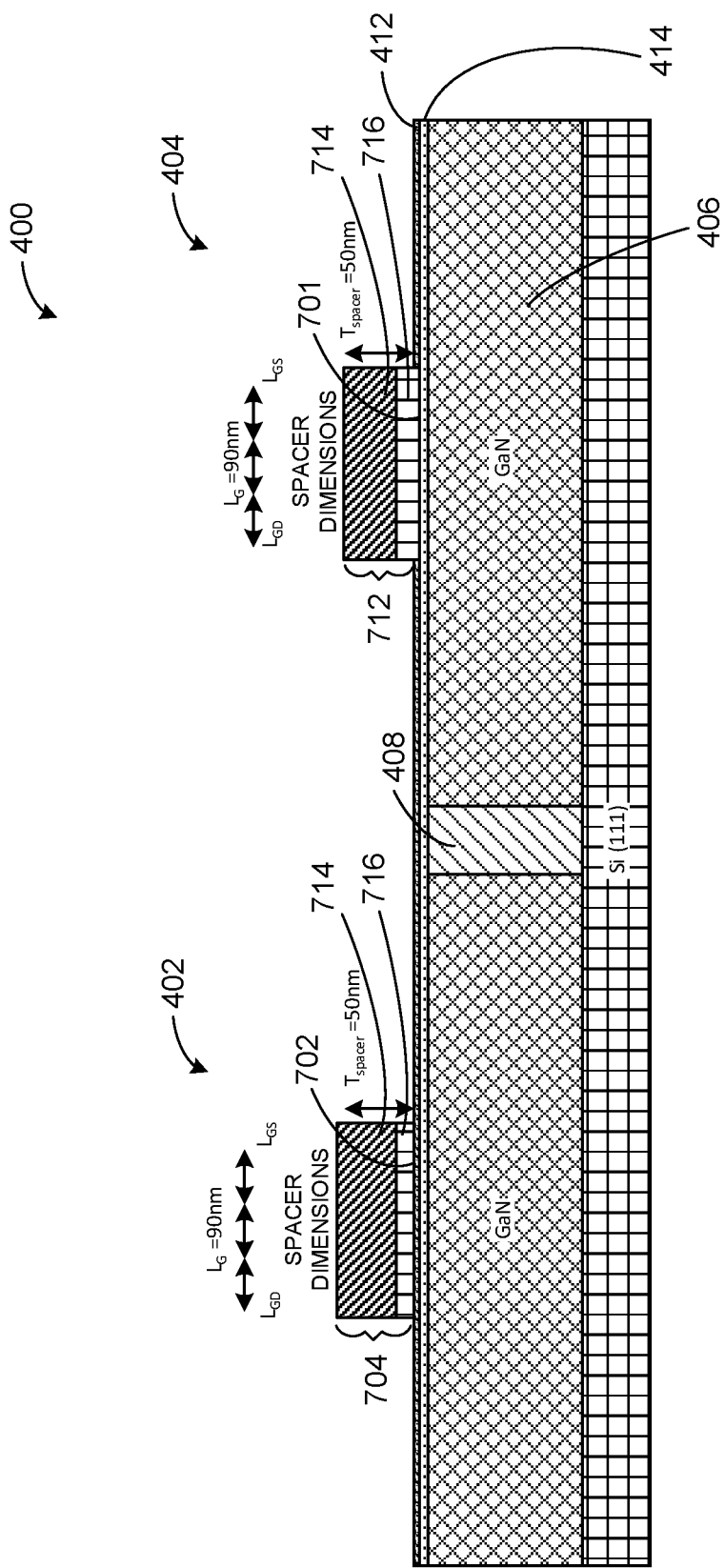

Turning to FIG. 7, the voltage tuning layer 412 is etched (e.g., partially etched, selectively etched, mask etched, chemically etched, etc.) to reveal an opening 701. In this particular example, this etching process utilizes boron trichloride ($BCl_3$) or sulfur hexafluoride ($SF_6$) after at least a portion of the planarization oxide 604 (shown in FIG. 6) is etched and/or mechanically removed (e.g., during a polishing operation). In contrast, a portion 702 of the voltage tuning layer 412 of the D-mode side 402 remains and is not etched. In this example, the D-mode side 402 is separated (e.g., electrically isolated) from the E-mode side 404 by the oxide layer 408 of FIG. 4.

While a chemical and/or wet etch process is described in connection with the example of FIG. 7, any appropriate process and/or selective etching process may be used to etch and/or partially etch the voltage tuning layer 412. For example, the voltage tuning layer 412 may be etched using other etching processes including, but not limited to, other chemical etching processes, photo-etching, UV exposure, photochemical processes, electro-etching and/or mechanical processes, etc.

To provide precursor(s) for later-added transistor gate structures, spacers (e.g., standoffs) 704, 712 corresponding to the D-mode side 402 and the E-mode side 404, respectively, are provided and/or built/deposited over the bodies 406. In particular, the spacers 704, 712 each include a silicon nitride layer 714 and an aluminum oxide layer 716. The spacers 704, 712 may be added as layers or epitaxially grown from the respective bodies 406 and/or the voltage tuning layer 412. In this example, the spacers 704, 712 have an approximate height on the order of about 25-100 nm (e.g., 50 nm) from the voltage tuning layer 412 and an approximate overall width on the order of about 90-270 nm.

Figure 8:
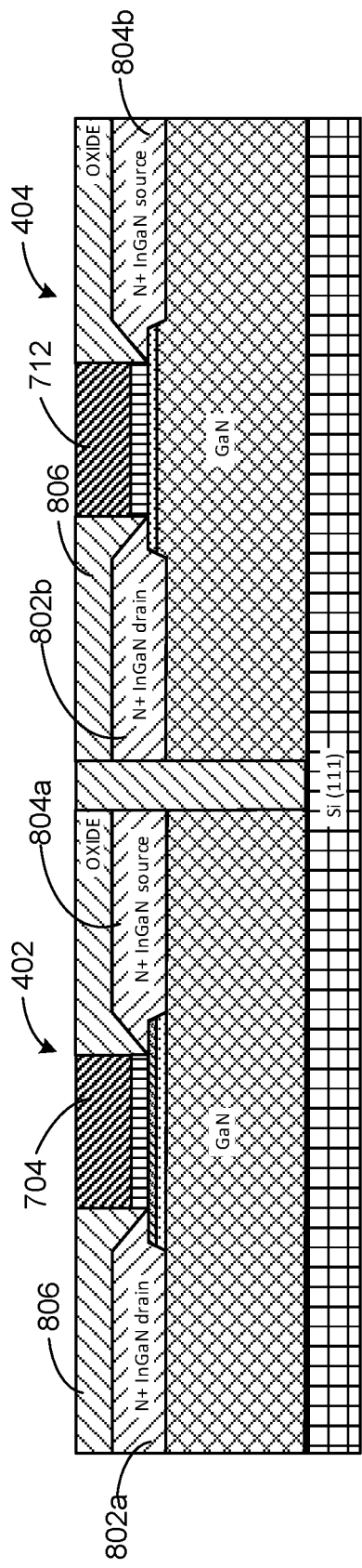

Turning to FIG. 8, a transistor drain 802a and a transistor source 804a are added to the D-mode side 402 and, likewise, a transistor drain 802b and a transistor source 804b are added to the E-mode side 404. However, a gate structure (e.g., a gate contact structure) has not yet been fully defined. According to the illustrated example of FIG. 8, an interlayer dielectric or oxide layer 806 is added/deposited/applied above each of the transistor drains 802a, 802b as well as the transistor sources 804a, 804b and, in turn, the example oxide layer 806 surrounds the spacers 704, 712.

Figure 9:
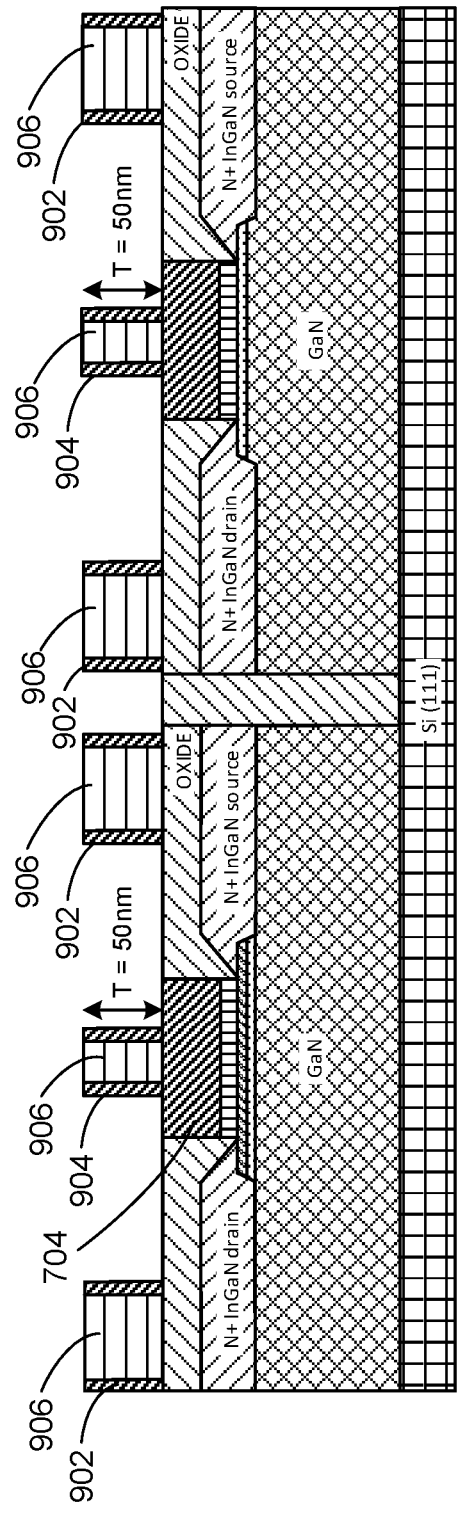

FIG. 9 depicts provided and/or grown source/drain structures 902 as well as gate structures 904. In this example, stand-in materials (e.g., materials to be later etched, dummy materials) 906 are provided/deposited into the corresponding structures 902, 904. The source/drain structures 902 as well as the gate structures 904 of the illustrated example are precursors for later contact/interconnect and gate structures.

Figure 10:
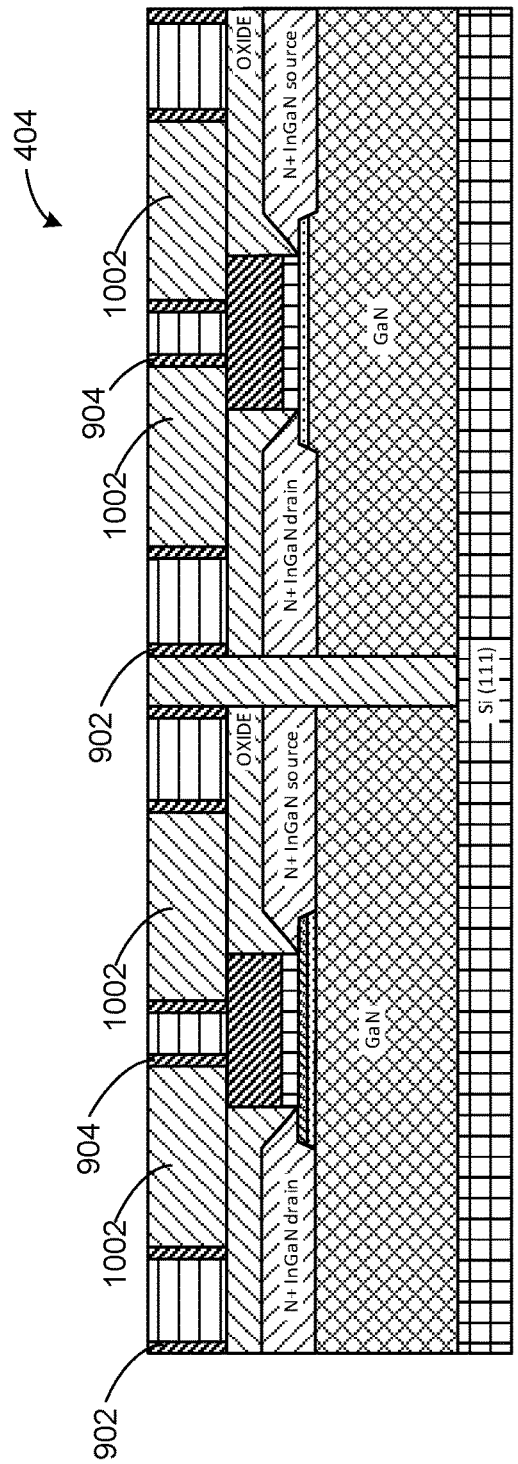

FIG. 10 depicts planarization of added oxide (e.g., an additional oxide layer) 1002. In particular, the additional oxide 1002 is added to surround the source/drain structures 902 and the gate structures 904. As a result, structure and/or mechanical support provided by the oxide 1002 will be used to at least partially define interconnect structures that are to be fabricated.

Figure 11:
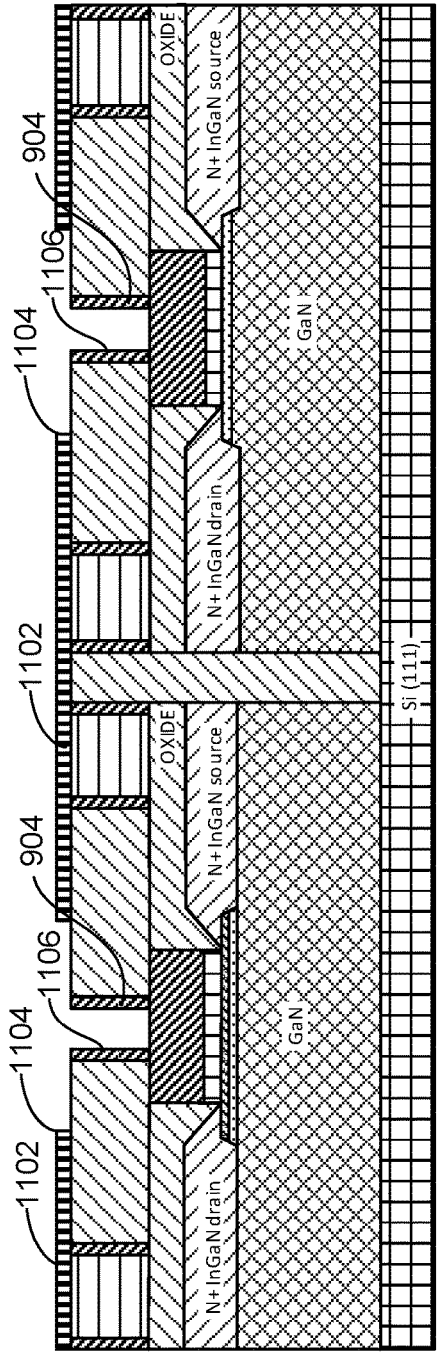

Turning to FIG. 11, an etching process is depicted for gate interconnect definition. In particular, a mask 1102 with openings 1104 is provided or deposited. Accordingly, an etched surface or opening 1106 of the illustrated example is exposed based on the etching process done in conjunction with the mask 1102, thereby exposing the gate structures 904 in this example.

Figure 12:
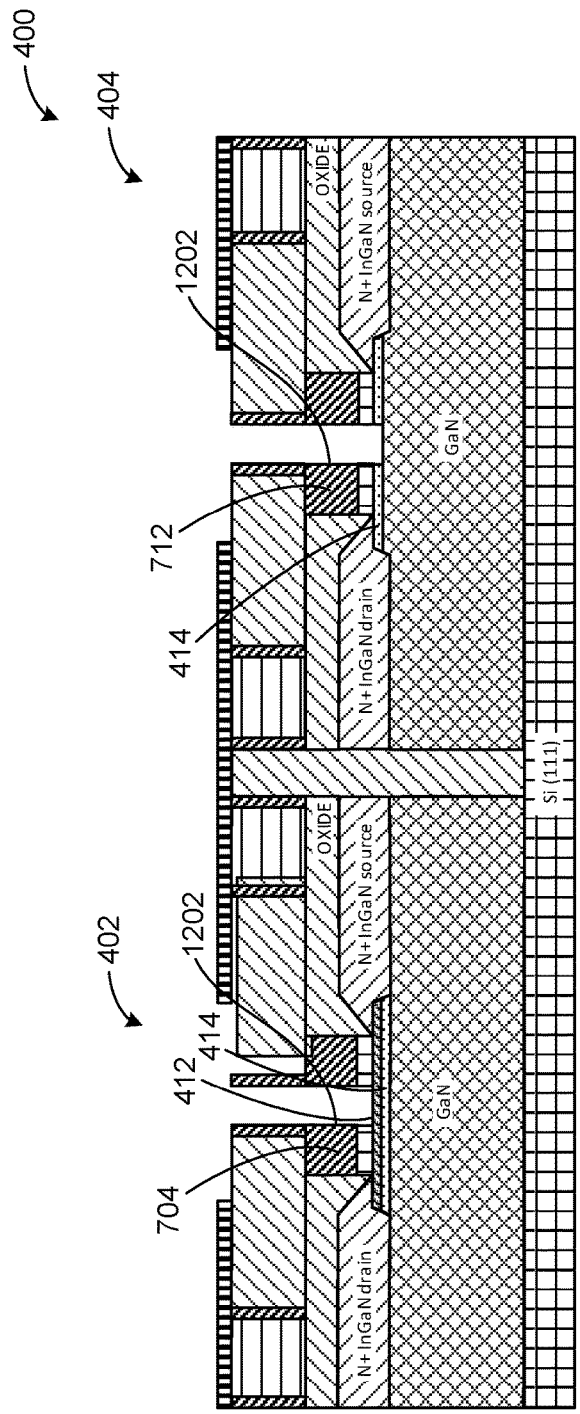

FIG. 12 depicts an additional etching process of the spacer 704 of the D-mode side 402 and the spacer 712 of the E-mode side 404 to define openings 1202, thereby exposing areas and/or surfaces so that a gate contact or interconnect may be defined.

Figure 13:
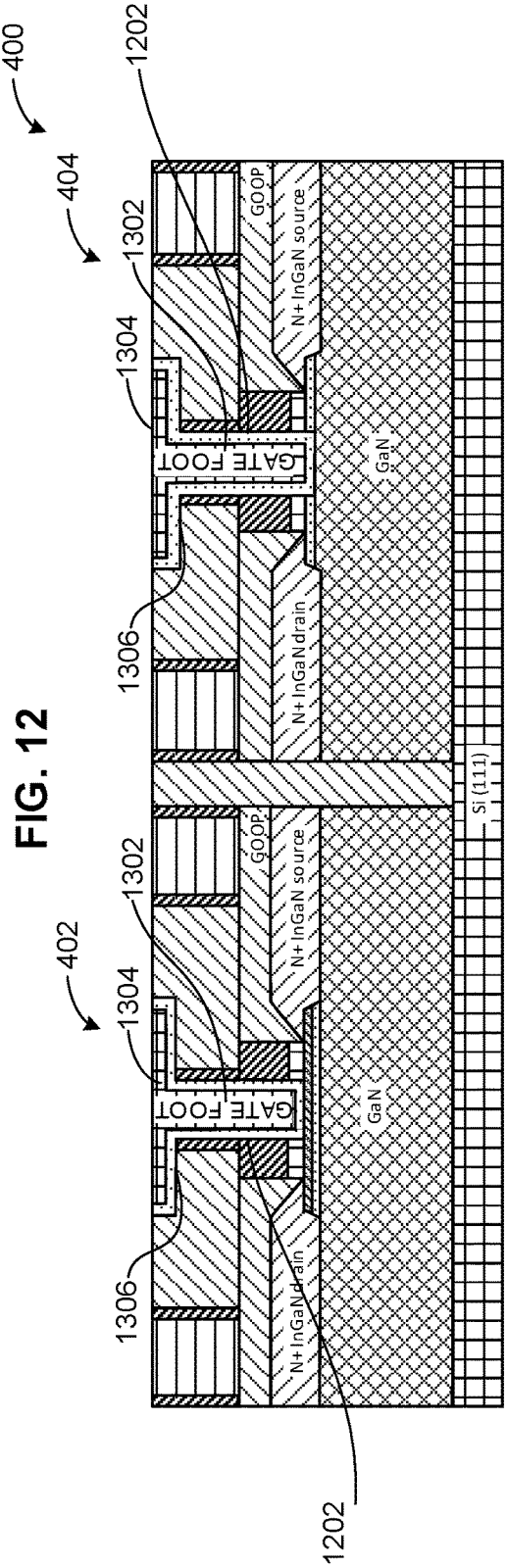

The illustrated example of FIG. 13 depicts gate foots (e.g., gate contacts) 1302 being provided to and/or grown from the respective openings 1202. In particular, each of the example gate foots 1302 are printed, epitaxially grown and/or deposited to both the D-mode side 402 and the E-mode side 404. In this example, both of the gate foots 1302 have a flange portion 1304. Further, each of the gate foots 1302 are at least partially surrounded by a dielectric layer (e.g., a silicon dioxide layer) 1306.

Turning to FIG. 14, an example structure 1400 in accordance with the teachings of this disclosure is shown. In this example, additional metallization and/or structures 1402 are added to the respective gate foots 1302. Additionally, metal interconnects 1404 are electrically coupled to the respective drains 802a, 802b and sources 804a, 804b. Accordingly, transistor structures defined as E-mode/D-mode device pairs have been defined/produced. In this example, further processing to couple the example structure 1400 to other devices and/or other interconnects will be defined through subsequent fabrication processing.

According to the illustrated example of FIG. 14, the D-mode side 402 of the example structure 1400 includes a defined D-mode device 1410 with a corresponding gate and/or gate structure 1411, along with the corresponding drain 802a and the source 804a. The D-mode device includes both the voltage tuning layer 412 that is in contact with the corresponding foot 1302 and the polarization layer 414. The E-mode side 404 of the example structure 1400 includes an E-mode device 1412 with a corresponding gate (e.g., a gate structure) 1414 as well as the corresponding drain 802b and the source 804b. In this example, the E-mode device 1412 includes the polarization layer 414, but not the voltage tuning layer 412. In particular, the corresponding gate foot 1302 of the illustrated example extends through the polarization layer 414 to the corresponding body 406 at the E-mode device 1412. In other words, the gate foot 1302 passes through the aforementioned opening 1202 to be coupled (e.g., directly coupled) to the corresponding body 406 for the E-mode device 1412.

Example 1 includes a multilayered die including a depletion mode device having a first polarization layer and a voltage tuning layer, and an enhancement mode device that is adjacent the depletion mode device, where the enhancement mode device has a second polarization layer, and where the second polarization layer includes an opening corresponding to a gate of the enhancement mode device.

Example 2 includes the subject matter of Example 1, where the first and second polarization layers are applied during a same process.

Example 3 includes the subject matter of any one of Examples 1 or 2, wherein at least one of the first or second polarization layers include an aluminum indium nitride layer, and an aluminum nitride layer.

Example 4 includes the subject matter of Example 3, where the aluminum indium nitride layer and the aluminum nitride layer are each approximately 1 to 10 nanometers in thickness.

Example 5 includes the subject matter of any one of Examples 1 to 4, where the voltage tuning layer includes aluminum gallium nitride having less than 40% of aluminum by volume.

Example 6 includes the subject matter of any one of Examples 1 to 5, where the voltage tuning layer is approximately 2 to 8 nanometers in thickness.

Example 7 includes an integrated circuit device including a plurality of device pairs, where each device pair includes a depletion mode device having a voltage tuning layer and a first polarization layer, and an enhancement mode device adjacent to the depletion mode device; where the enhancement mode device includes a second polarization layer having an opening corresponding to a gate of the enchantment mode device.

Example 8 includes the subject matter of Example 7, where the first and second polarization layers are defined during a same process.

Example 9 includes the subject matter of any one of Examples 7 or 8, where the voltage tuning layer includes gallium nitride or aluminum gallium nitride.

Example 10 includes the subject matter of any one of Examples 7 to 9, where the voltage tuning layer is doped with p-type dopants.

Example 11 includes the subject matter of any one of Examples 7 to 10, where at least one of the first or second polarization layers includes an aluminum indium nitride layer, and an aluminum nitride layer.

Example 12 includes the subject matter of Example 11, where the aluminum indium nitride layer and the aluminum nitride layer are each approximately 1 to 10 nanometers in thickness.

Example 13 includes the subject matter of any one of Examples 7 to 12, where the voltage tuning layer is approximately 2 to 8 nanometers in thickness.

Example 14 includes a silicon on chip device having the subject matter of any one of Examples 7 to 13.

Example 15 includes a method of producing a multilayered die having an adjacent device pair with an enhancement mode device and a depletion mode device, the method comprising including applying a voltage tuning layer, where the depletion mode device includes the voltage tuning layer, applying a polarization layer, where the enhancement mode device and the depletion mode device include first and second portions of the polarization layer, respectively, and defining an opening in the polarization layer that corresponds to a gate of the enhancement mode device.

Example 16 includes the subject matter of Example 15, where the opening is defined by at least one etching process.

Example 17 includes the subject matter of any one of Examples 15 or 16, where the polarization layer includes an aluminum indium nitride layer, and an aluminum nitride layer.

Example 18 includes the subject matter of any one of Examples 15 to 17, where the voltage tuning layer includes gallium nitride.

Example 19 includes the subject matter of any one of Examples 15 to 18, where the voltage tuning layer includes aluminum gallium nitride having less than 40% of aluminum by volume.

Example 20 includes the subject matter of any one of Examples 15 to 19, where the voltage tuning layer is doped by a p-type dopant.

From the foregoing, it will be appreciated that the above disclosed methods, apparatus and articles of manufacture allow more power-efficient and compact semiconductor E/D devices by reducing overall thicknesses of layers, thereby reducing overall respective packaging/structures of a semiconductor die and/or silicon on chip structures.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A die comprising:
   a depletion mode device comprising a first source and a first drain, and a first portion of a polarization layer and a voltage tuning layer both between the first source and the first drain; and
   an enhancement mode device adjacent the depletion mode device, the enhancement mode device comprising a second source and a second drain, and a second portion of the polarization layer between the second source and the second drain, wherein the enhancement mode device is absent the voltage tuning layer between the second source and the second drain.

2. The die of claim 1, wherein the polarization layer comprises a first layer comprising aluminum, indium, and nitrogen on a second layer comprising aluminum and nitrogen, wherein the first layer has a greater thickness than the second layer.

3. The die of claim 2, wherein the voltage tuning layer comprises gallium and nitrogen and has a thickness less than the thickness of the second layer.

4. The die of claim 2, wherein the first layer and the second layer are each 1 to 10 nanometers in thickness.

5. The die of claim 2, wherein the voltage tuning layer comprises aluminum, gallium, and nitrogen comprising less than 40% of aluminum by volume and has a thickness less than the thickness of the second layer.

6. The die of claim 2, wherein the voltage tuning layer comprises gallium, nitrogen, and magnesium.

7. An integrated circuit device comprising:
   a plurality of device pairs, a first device pair of the plurality of device pairs comprising:
   a depletion mode device comprising a first source and a first drain, and a first portion of a polarization layer and a voltage tuning layer both between the first source and the first drain; and
   an enhancement mode device electrically coupled to the depletion mode device, the enhancement mode device comprising a second source and a second drain, and a second portion of the polarization layer between the second source and the second drain, wherein the enhancement mode device is absent the voltage tuning layer between the second source and the second drain.

8. The integrated circuit device of claim 7, wherein the polarization layer comprises a first layer comprising aluminum, indium, and nitrogen on a second layer comprising aluminum and nitrogen, wherein the first layer has a greater thickness than the second layer.

9. The integrated circuit device of claim 8, wherein the voltage tuning layer comprises one of gallium and nitride or aluminum, gallium, and nitrogen and has a thickness less than the thickness of the second layer.

10. The integrated circuit device of claim 8, wherein the voltage tuning layer comprises gallium, nitrogen, and p-type dopants.

11. The integrated circuit device of claim 10, wherein the p-type dopants comprise magnesium.

12. The integrated circuit device of claim 11, wherein the first layer and the second layer are each 1 to 10 nanometers in thickness.

13. The integrated circuit device of claim 7, wherein the voltage tuning layer is 2 to 8 nanometers in thickness.

14. The integrated circuit device of claim 7, wherein the voltage tuning layer comprises aluminum, gallium, and nitrogen comprising less than 40% of aluminum by volume.

15. A die comprising:
   a depletion mode device over a substrate, the depletion mode device comprising a first portion of a polarization layer and a voltage tuning layer on the first portion of the polarization layer, wherein the first portion of the polarization layer and the voltage tuning layer both extend from a first source to a first drain of the depletion mode device, and the depletion mode device further comprises a gate structure on the voltage tuning layer;
   an enhancement mode device over the substrate, the enhancement mode device comprising a second portion of the polarization layer extending between a second source and a second drain of the enhancement mode device, wherein the enhancement mode device is absent the voltage tuning layer between the second source and the second drain.

16. The die of claim 15, wherein the enhancement mode device further comprises a second gate structure on a body comprising gallium and nitrogen, wherein the second gate structure extends through an opening in the polarization layer to the body.

17. The die of claim 15, wherein the polarization layer comprises a first layer comprising aluminum, indium, and nitrogen on a second layer comprising aluminum and nitrogen, wherein the first layer has a first thickness greater than a second thickness of the second layer.

18. The die of claim 15, wherein the voltage tuning layer comprises gallium and nitrogen and has a third thickness less than the first thickness and greater than the second thickness.

19. The die of claim 15, wherein the voltage tuning layer comprises aluminum, gallium, and nitrogen comprising less than 40% of aluminum by volume and has a third thickness less than the first thickness and greater than the second thickness.

20. The die of claim 15, wherein the voltage tuning layer comprises gallium, nitrogen, and magnesium and has a third thickness less than the first thickness and greater than the second thickness.

\* \* \* \* \*